United States Patent
Ueda et al.

(10) Patent No.: US 7,274,129 B2
(45) Date of Patent: Sep. 25, 2007

(54) SURFACE ACOUSTIC WAVE DEVICE AND METHOD OF FABRICATING THE SAME

(75) Inventors: Masanori Ueda, Yokohama (JP); Osamu Kawachi, Yokohama (JP); Michio Miura, Kawasaki (JP); Suguru Warashina, Kawasaki (JP)

(73) Assignees: Fujitsu Media Devices Limited, Yokohama (JP); Fujitsu Limited, Kawasaki (JP)

( * ) Notice: Subject to any disclaimer, the term of this patent is extended or adjusted under 35 U.S.C. 154(b) by 305 days.

(21) Appl. No.: 10/812,362

(22) Filed: Mar. 30, 2004

(65) Prior Publication Data
US 2004/0217670 A1 Nov. 4, 2004

(30) Foreign Application Priority Data
Apr. 8, 2003 (JP) ............................. 2003-104593

(51) Int. Cl.
*H01L 41/08* (2006.01)
(52) U.S. Cl. ................................................. 310/313 R
(58) Field of Classification Search ............ 310/313 R, 310/344, 348, 313 A, 313 B, 313 C, 313 D; 333/197, 193; 257/704
See application file for complete search history.

(56) References Cited

U.S. PATENT DOCUMENTS

| | | | |
|---|---|---|---|
| 5,438,305 A * | 8/1995 | Hikita et al. ............. | 310/313 R |
| 6,281,436 B1 * | 8/2001 | Gotoh et al. ................ | 174/538 |
| 6,518,501 B1 * | 2/2003 | Kawahara et al. .......... | 257/704 |
| 7,034,441 B2 * | 4/2006 | Ono et al. ................... | 310/344 |

FOREIGN PATENT DOCUMENTS

| | | |
|---|---|---|
| JP | 54-014137 | 2/1979 |
| JP | 2-143836 U | 12/1990 |
| JP | 4-170811 A | 6/1992 |
| JP | 6-268473 A | 9/1994 |
| JP | 7-022808 A | 1/1995 |
| JP | 7-86442 A | 3/1995 |
| JP | 8-18390 | 1/1996 |
| JP | 01-053088 | 2/2001 |
| JP | 2001-110946 | 4/2001 |
| JP | 2001110946 * | 4/2001 |
| JP | 2002-184960 A | 6/2002 |
| JP | 2002-261581 A | 9/2002 |
| JP | 2002-330050 A | 11/2002 |
| KR | 2002-43236 | 6/2002 |
| WO | 0217483 | 2/2002 |

OTHER PUBLICATIONS

Hideki Takagi, "Room-Temperature Bonding of Silicon Wafers By Means Of The Surface Activation Method", Report of Mechanical Engineering Laboratory, No. 189, Dec. 2000, 14-pages.

* cited by examiner

Primary Examiner—Darren Schuberg
Assistant Examiner—Karen Beth Addison
(74) Attorney, Agent, or Firm—Arent Fox LLP

(57) ABSTRACT

A surface acoustic wave device includes, a first substrate, a surface acoustic wave chip attached to the first substrate, and a second substrate that hermetically seals the surface acoustic wave chip. At least one of the first and second substrates includes. The first and second substrates have respective joining surfaces. An electric circuit is formed on a surface area of the first substrate other than the joining surfaces.

18 Claims, 13 Drawing Sheets

SURFACE ACOUSTIC WAVE DEVICE AND METHOD OF FABRICATING THE SAME

BACKGROUND OF THE INVENTION

1. Field of the Invention

The invention generally relates to surface acoustic wave devices and methods of fabricating the same, and more particularly, to a surface acoustic wave device having a SAW chip that is attached to a first substrate and is sealed with a second substrate and a method of fabricating the same.

2. Description of the Related Art

Recently, there has been a demand to downsize electronic elements mounted to electronic devices and improve the performance thereof with downsizing and high performance of the electronic devices. For instance, there have been similar demands on surface acoustic wave (SAW) devices that are electronic parts used as filters, delay lines, oscillators in electronic devices capable of transmitting and receiving radio waves.

Figure 1A:
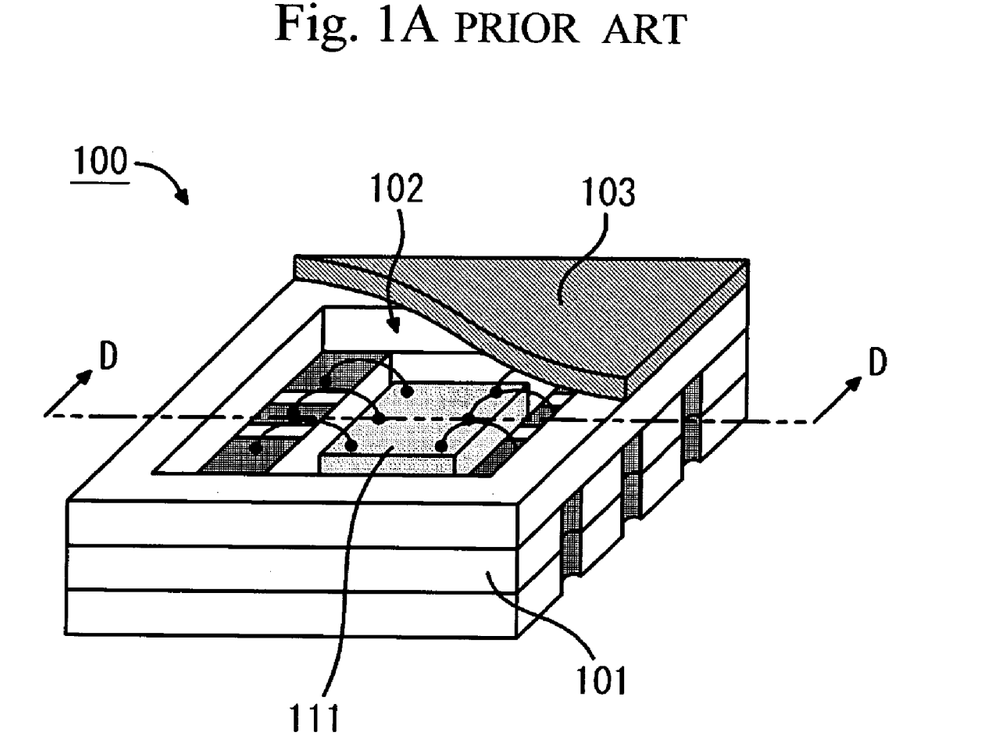
FIG. 1A is a perspective view of a conventional SAW device.
Figure 1B:
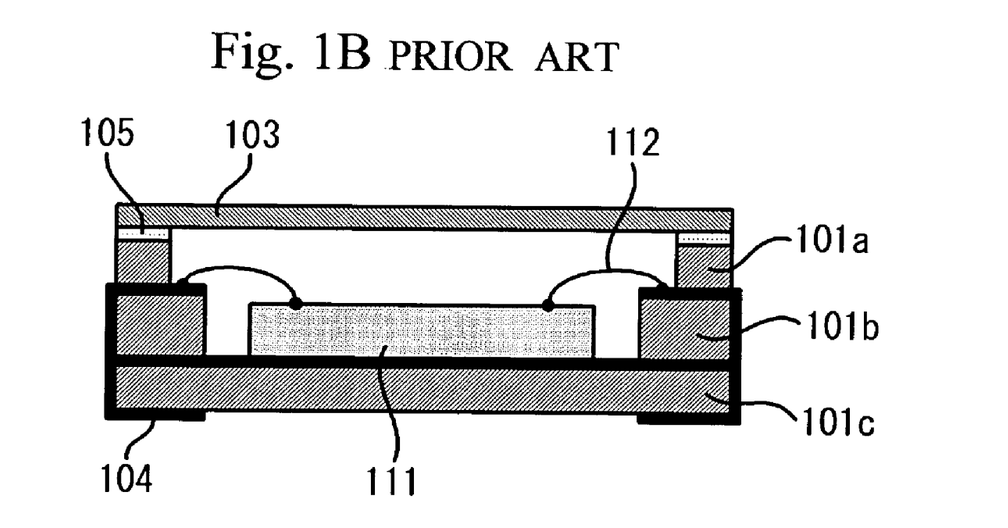
FIG. 1B is a cross-sectional view taken along a line 5 shown in FIG. 1A.

A description will now be given of a filter device equipped with a conventional SAW device. FIG. 1A is a perspective view of a SAW filter 100, and FIG. 1B is a cross-sectional view taken along a line D-D shown in FIG. 1A. This type of SAW device is disclosed, for example, Japanese Patent Application Publication No. 8-18390 (see FIG. 4, particularly).

Referring to FIG. 1A, the SAW filter 100 includes a ceramic package 101 having a cavity 102, a metal cap 103 and a SAW chip 111. The SAW chip 111 is placed in the cavity 102, which is sealed with the metal cap 103. As shown in FIG. 1B, the package 101 has a three-layer structure composed of three joined substrates 101a, 101b and 101c. Electrode pads are provided on the top of the substrate 101b, and foot patterns 104 are provided on the bottom of the substrate 10c. Wiring patterns are provided on sides of the package 101, and connect the electrode pads and the foot patterns 104. The SAW chip 111 is fixed to the bottom of the cavity 102 so that comb-like electrodes (an interdigital transducer: IDT) on the SAW chip 111 face up. Electrode pads on the SAW chip 111 are connected to the pads via metal wires 112. The metal cap 103 is bonded to the top surface of the package 101 by a bonding material 105 made of solder or resin.

Figure 2A:
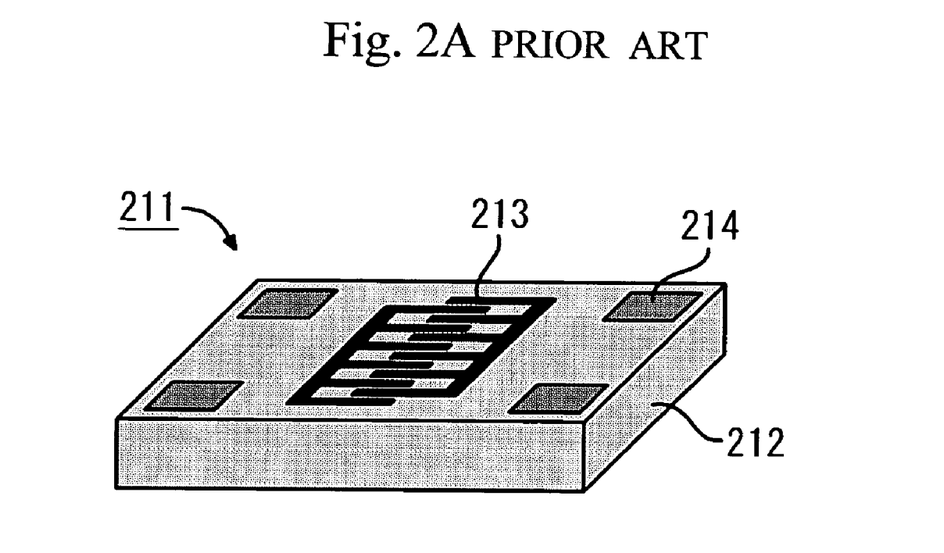
FIG. 2A is a perspective view of a SAW chip used in a conventional SAW device shown in FIG. 2B.
Figure 2B:
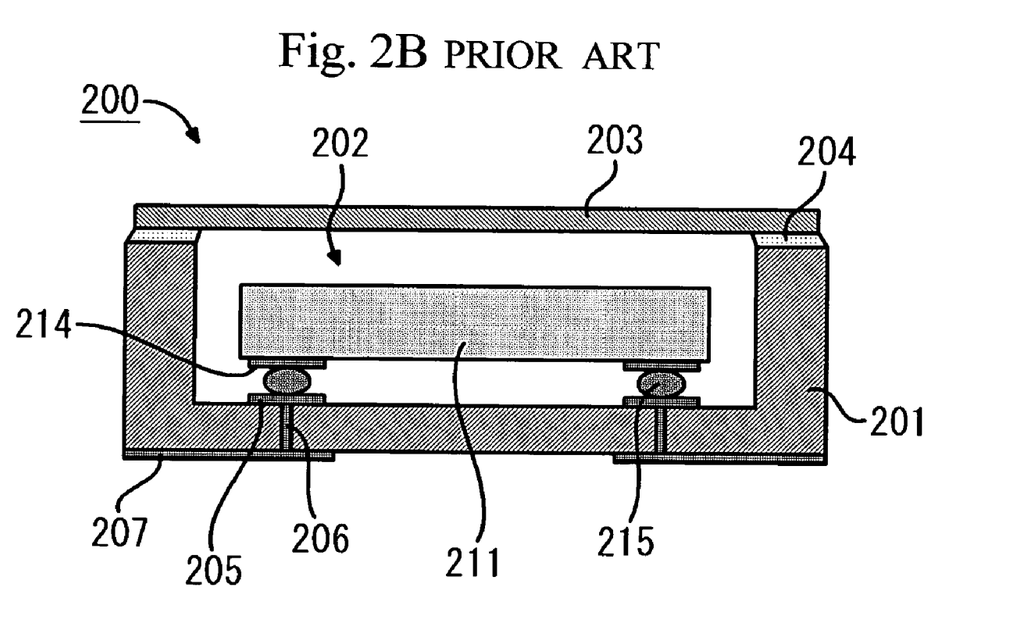
FIG. 2B is a cross-sectional view of the conventional SAW device that has the SAW chip shown in FIG. 2A.

There is another proposal to mount the SAW chip in flip-chip fashion (see, for example, Japanese Patent Application Publication No. 2001-110946). FIGS. 2A and 2B show this type of SAW device. More particularly, FIG. 2A is a perspective view of a SAW chip 211 of a SAW filter 200, and FIG. 2B is a cross-sectional view of the SAW filter 200, which view corresponds to a cross section taken along the line D-D shown in FIG. 1A.

As shown in FIG. 2A, the SAW chip 211 has a piezoelectric material substrate (hereinafter referred to as piezoelectric substrate) 212. Comb-like electrodes 213 that form an IDT are formed on a main surface (upper surface) of the piezoelectric substrate 212. Electrode pads 214 are provided on the main surface and are electrically connected to the IDT 213 via a wiring pattern. As shown in FIG. 2B, a package 201 has a cavity 202. Electrode pads 205 are provided on the bottom of the cavity 202, which is also referred to as die-attached surface. The pads 205 are positioned so as to correspond to the pads 214 of the SAW chip 211. The SAW chip 211 is flip-chip mounted in the cavity 202 so that the IDT 213 and the electrode patterns 214 face the die-attached surface. The pads 214 and 205 are bonded via metal bumps 215 so that these pads are electrically and mechanically fixed together. The pads 205 are electrically connected to foot patterns 207 on the backside of the package 201 by means of via-wiring lines 206, which penetrate the bottom portion of the package 201. A metal cap 203 closes an opening of the cavity 202 and is bonded to the package 201 by a bonding material 204.

Figure 3A:
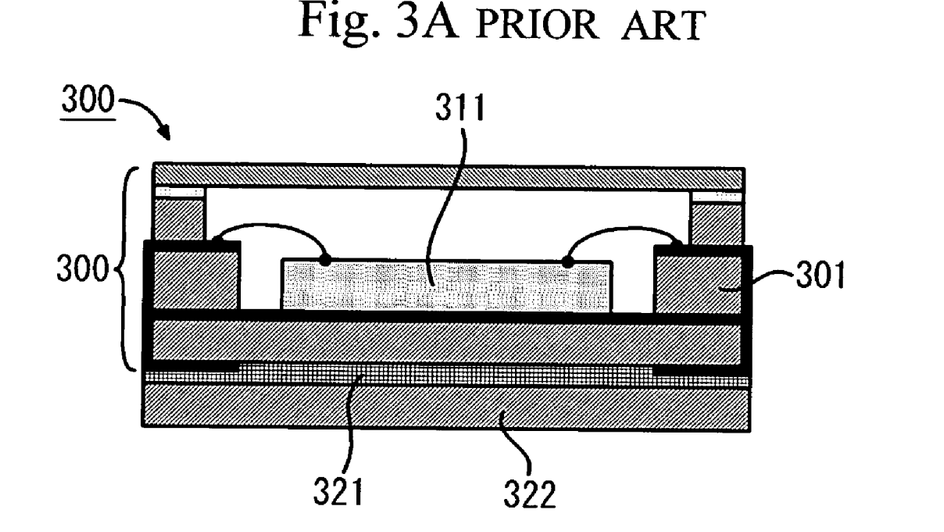
FIG. 3A is a cross-sectional view of a conventional duplexer.
Figure 3B:
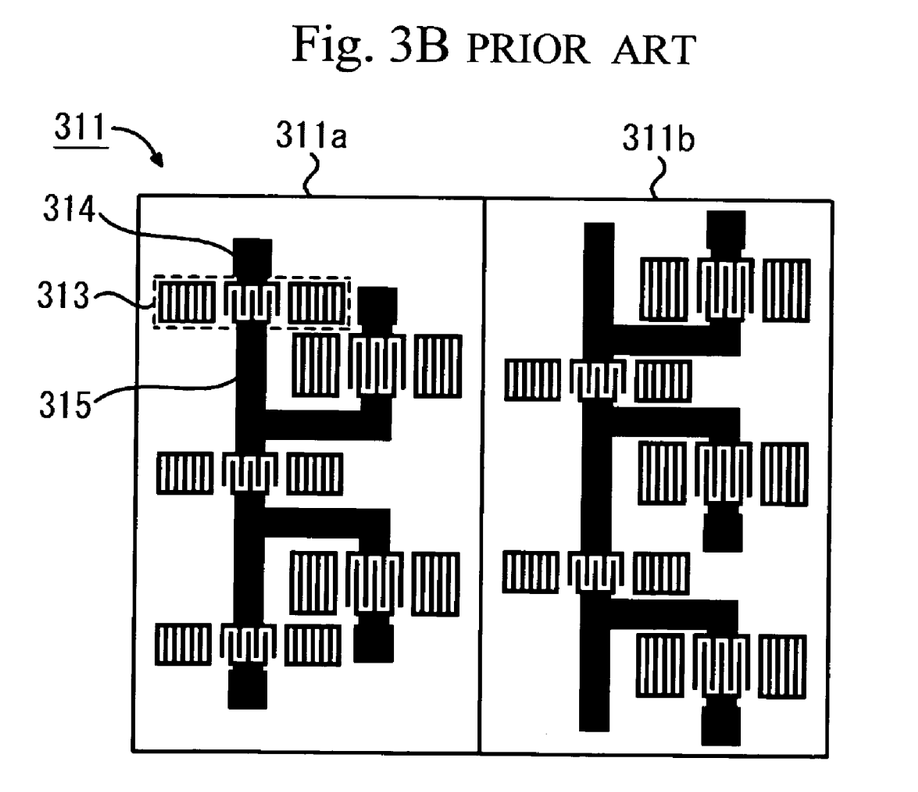
FIG. 3B is a plan view of a SAW chip used in the duplexer shown in FIG. 3A.

A duplexer equipped with a transmit filter and a receive filter may be formed by using SAW filters as mentioned above. Such a duplexer will now be described with reference to FIGS. 3A and 3B. A duplexer 300 shown in these figures has a transmit filter 311a and a receive filter 311b, each of which filters is like the SAW filter 100. FIG. 3A shows a cross section view of the duplexer 300, which corresponds to that taken along the line D-D shown in FIG. 1A. FIG. 3B is a plan view of a SAW chip 311.

Referring to FIG. 3A, the duplexer 300 has a package 301 in which the SAW chip 311 is mounted. A matching-circuit board 321 and a main board 322 are provided on the bottom side of the package 301. The matching-circuit board 321 is provided in such a way as to be sandwiched by the main board 322. As shown in FIG. 3B, the SAW chip 311 is equipped with the transmit filter 311a and the receive filter 311b. Each of the filters 311a and 311b has respective IDTs 313 arranged in ladder fashion. The IDTs 313 are connected to electrode pads 314 via wiring patterns 315.

The SAW filter or duplexer as mentioned above is required to have the SAW chip hermetically sealed. The metal cap is used, along with bonding material or resin, to accomplish hermetical sealing.

However, there are drawbacks to be solved. A large joining area (seal width) at the interface between the package and the cap is needed to hermetically seal the cavity with high reliability. However, this prevents downsizing of the package. Downsizing of package is also restricted due to the use of wires because the wires need a relatively wide pattern for bonding. The package is the multilayer substrate made of ceramics, which is comparatively expensive. The device needs the process of assembling the cap, chip and package device, and is therefore costly.

SUMMARY OF THE INVENTION

It is an object of the present invention to provide a downsized, less expensive, productive SAW device and a method of fabricating the same.

This object of the present invention is achieved by a surface acoustic wave device comprising: a first substrate; a surface acoustic wave chip attached to the first substrate; and a second substrate that hermetically seals the surface acoustic wave chip, at least one of the first and second substrates comprising silicon, the first and second substrates having joining surfaces, an electric circuit being formed on a surface area of the first substrate other than the joining surfaces. The use of silicon mentioned above makes it possible to easily fabricate the device with high accuracy by means of photolithography and etching techniques. Thus, productivity and yield can be improved, so that downsizing can be achieved. The electric circuit does not need to be mounted on another substrate. This contributes to downsizing.

The above object of the present invention is also achieved by a method of fabricating a surface acoustic wave device comprising the steps of: mounting a surface acoustic wave device on a first substrate on which an electric circuit is formed; and joining the first substrate and a second substrate so that the surface acoustic wave device is hermetically sealed, at least one of the first and second substrates comprising silicon, the electric circuit being positioned on a surface area of the first substrate other than joining surfaces of the first and second substrates.

BRIEF DESCRIPTION OF THE DRAWINGS

Other objects, features and advantages of the present invention will become more apparent from the following detailed description when read in conjunction with the accompanying drawings, in which.

DESCRIPTION OF THE PREFERRED EMBODIMENTS

Figure 4A:
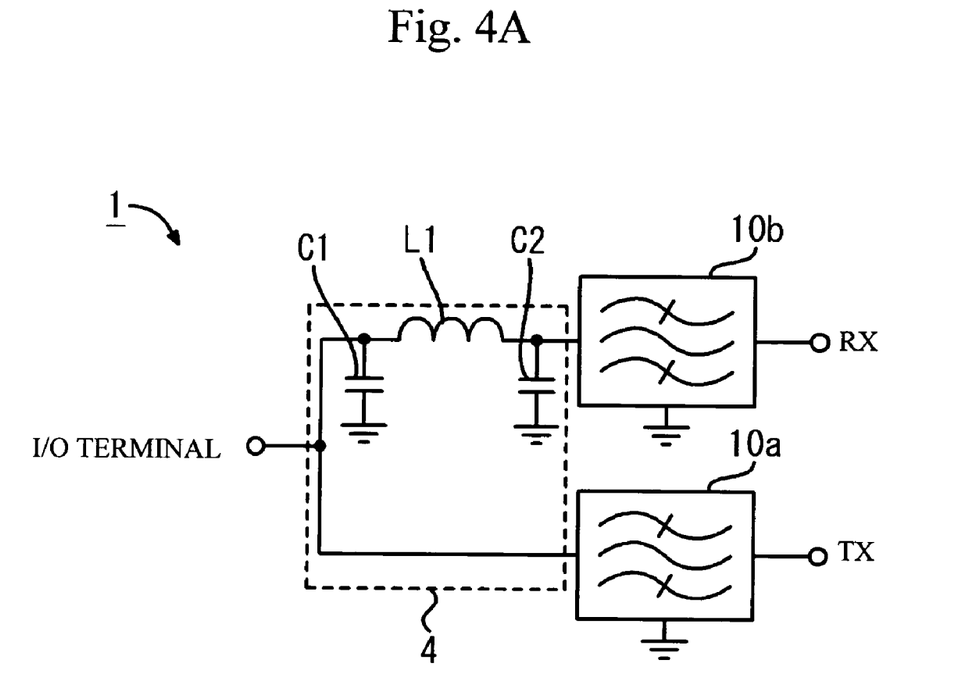
FIG. 4A is a circuit diagram of a duplexer according to the present invention.
Figure 4B:
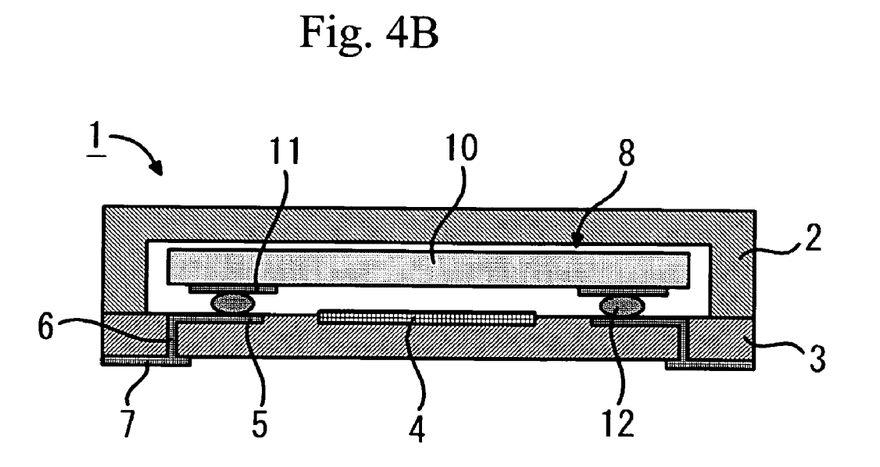
FIG. 4B is a cross-sectional view of the duplexer shown in FIG. 4A.
Figure 5A:
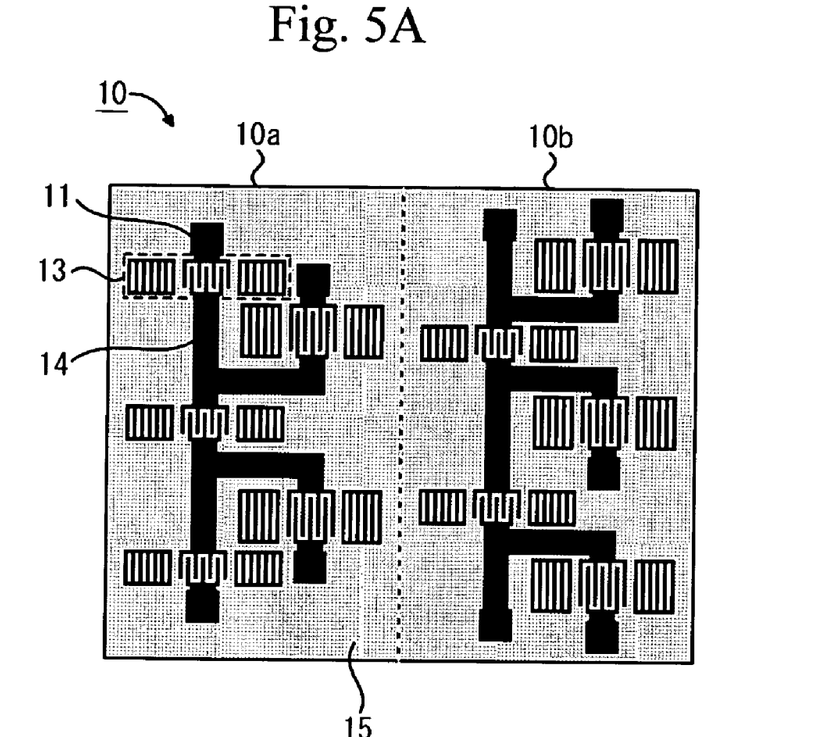
FIG. 5A is a plan view of a SAW chip.
Figure 5B:
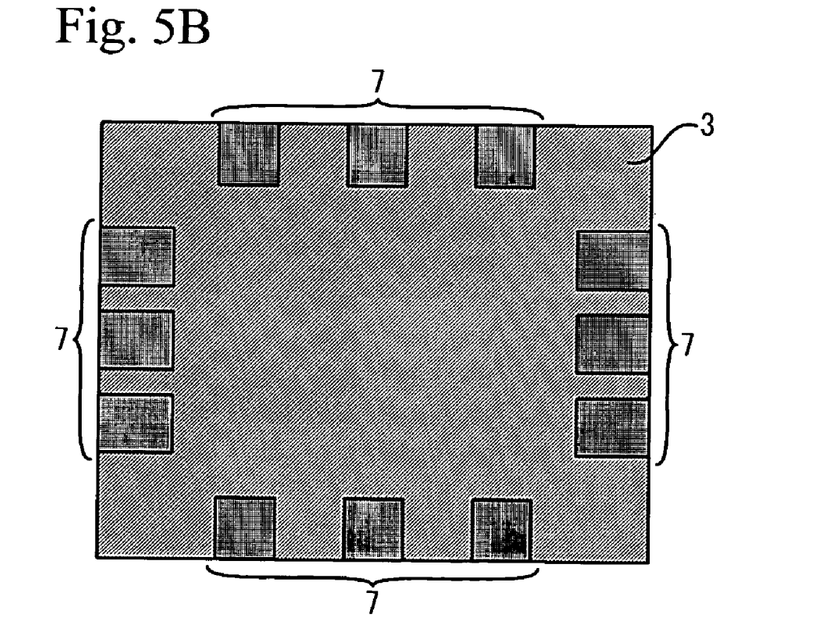
FIG. 5B is a bottom view of the duplexer shown in FIG. 4B.

A description will now be given, with reference to FIGS. 4A, 4B, 5A and 5B, of the principles of the present invention. FIGS. 4A, 4B, 5A and 5B illustrate a duplexer based on the principles of the present invention. FIG. 4A is a circuit diagram of a duplexer 1, and FIG. 4B is a cross-sectional view of the duplexer 1. FIG. 5A is a plan view of a SAW chip 10 having a transmit filter 10a and a receive filter 10b formed on a single piezoelectric material substrate (hereinafter referred to as a piezoelectric substrate) 15. FIG. 5B is a bottom view of the duplexer 1.

Referring to FIG. 4A, the duplexer 1 is composed of the transmit filter 10a, the receive filter 10b, and a matching circuit 4 for input impedance matching. The matching circuit 4 is interposed between the common I/O terminal of the transmit filter 10a and the common terminal of the receive filter 10b. The matching circuit includes a low-pass filter provided between an input/output terminal of the duplexer and the common terminal of the receiver 10b. The low-pass filter is made up of capacitors C1 and C2 and an inductor L1 interposed therebetween. One ends of the capacitors C1 and C2 are grounded. The resonance frequency of the transmit filter 10a is lower than that of the receive filter 10b. If the transmit and receive frequencies are reverse to the above, the low-pass filter may be provided on the higher frequency side. The matching circuit 4 is not limited to the low-pass filter. The matching circuit 4 may be modified so that each low-pass filter or the like is provided to the respective filters 10a and 10b.

Referring to FIG. 4B, the duplexer 1 has a package that houses the SAW chip 10. The package includes a circuit board 3 and a cap 2 that hermetically seals a cavity 8 defined by the cap 2 in which the SAW chip 10 is mounted. The piezoelectric substrate 15 may be a piezoelectric single-crystal substrate of a 42° Y-cut X-propagation lithium tantalate (LiTaO$_3$: LT). The LT substrate has a linear expansion coefficient of 16.1 ppm/° C. in the X direction in which the SAW is propagated. The LT substrate may be replaced by a piezoelectric single-crystal substrate of Y-cut lithium niobate (LiNbO$_3$: LN).

As is shown in FIG. 5A, the transmit filter 10a has a plurality of IDTs 13 provided on the piezoelectric substrate 15, and the receive filter 10b has a plurality of IDTs 13. A wiring pattern 14 connects the IDTs 13 of the transmit filter 10a in a ladder structure. Similarly, the IDTs 13 of the receive filter 10b are connected by another wiring pattern in a ladder structure. Input/output electrode pads 11 are integrally formed with the wiring patterns 14. Electric signals are input to and output from the filters 10a and 10b via the input/output pads 11. The IDTs 13, the wiring patterns 14 and the input/output pads 11 may be formed by a single conductive layer that contains at least one of gold (Au), aluminum (Al), copper (Cu), titanium (Ti), chromium (Cr) and tantalum (Ta), or by a laminate of conductive layers, each of which contains at least one of Au, Al, Cu, Ti, Cr and Ta. The conductive patterns on the piezoelectric substrate 15 may be deposited by sputtering or the like.

The SAW chip 10 of the duplexer 1 is face-down bonded so that the main surface on which the IDTs 13 are formed faces the circuit board 3. The input/output pads 11 of the SAW chip 10 are bonded to electrode pads 5 formed on a die-attached surface of the circuit board 3 via metal bumps 12, which contains at least one of gold (Au), tin (Sn), aluminum (Al) and copper (Cu). Thus, the pads 11 and 5 are mechanically and electrically connected. The SAW chip 10 may be mounted in the face-up state. In this case, the pads 11 and 5 may be electrically connected by metal wires.

The electrode pads 5 connected to the SAW chip 10 are electrically connected to foot patterns 7 (FIGS. 4B and 5B) formed on the backside of the circuit board 3 through via-wiring lines 6 (FIG. 4B) that penetrate the circuit board 3. The foot patterns 7 serve as terminals for making external connections via which electric signals are input to and output from the SAW chip 10. The signal and ground terminals of the SAW chip 10 can be extended to the foot patterns 7 on the back surface of the package.

Preferably, the cap 2 is joined to the circuit board 3 by a surface activation process. More particularly, the joining surfaces of the circuit board 3 and the cap 2 are subjected to the surface activation process, this resulting in an amorphous layer, and are then joined together. The surface activation process may be applied to not only joining of circuit board 3 and the cap 2 but also to joining of a multi-board substrate having circuit boards integrally arranged in rows and columns and a multi-cap substrate having caps integrally arranged in rows and columns. The surface activation process will be described with reference to FIGS. 6A and 6B in which a multi-board substrate 3A and a multi-cap substrate 2A.

Figure 6A:
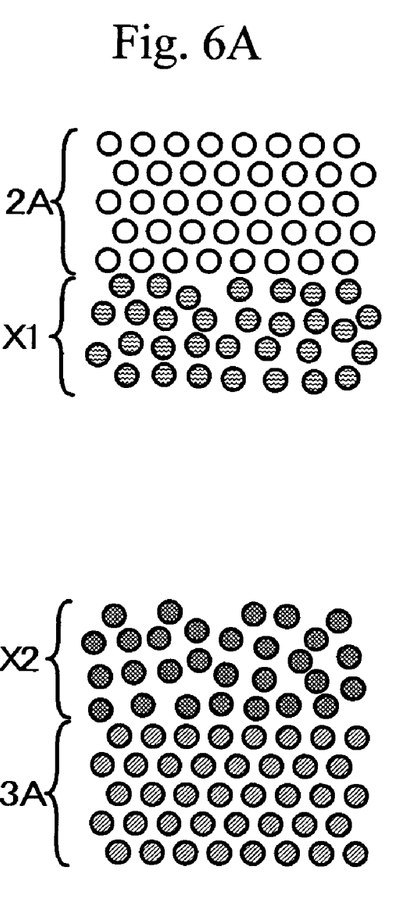
FIGS. 6A and 6B illustrate a surface activation process applied to joining surfaces of two substrates.

Referring to FIG. 6A, both of the substrates 2A and 3A are cleaned through RCA cleaning or the like, so that impurities X1 and X2 including compounds and adsorbate that adhere to the surfaces, especially the joining surfaces, are removed (cleaning process). RCA cleaning is one of the techniques that utilize solutions such as a cleaning solution of ammonia, hydrogen peroxide, and water, mixed at a volume mixing ratio of 1:1-2:5-7, and a cleaning solution of hydrochloric acid, hydrogen peroxide, and water, mixed at a volume mixing ratio of 1:1-2:5-7.

Figure 6B:
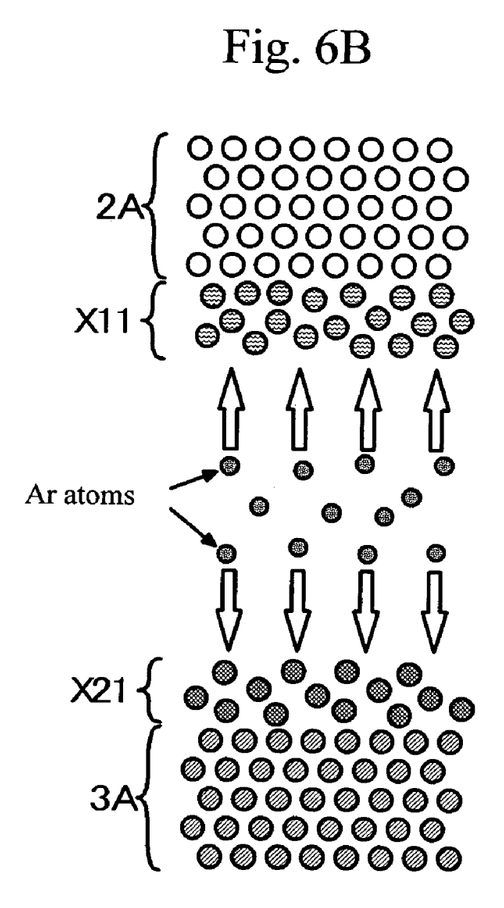

After the cleaned substrates are dried (drying process), as shown in FIG. 6B, the joining surfaces of the substrates 2A and 3A are exposed to ion beams, neutralized high-energy atom beams, or plasma of inert gas such as argon (Ar) or oxygen, so that residual impurities X11 and X21 are removed, and that the surfaces can be activated (activation process). The particle beams or plasma to be used are selected according to the materials of the substrates to be joined. For example, the surface activation process with inert gas is useful for many materials. Particularly, for silicon dioxide ($SiO_2$), ion beam or plasma of oxygen may also be used.

The piezoelectric substrate 2A and the silicon substrate 3A are then positioned and joined to each other (joining process). For most materials, this joining process may be carried out in a vacuum or in an atmosphere of a high purity gas such as nitrogen or an inert gas, though it may be carried out in the air. Also, it might be necessary to press the substrates 2A and 3A from both sides. This joining process can be carried out at room temperature or by heating the substrates 2A and 3A at a temperature of 100° C. or lower. The use of heating may increase the joining strength of the substrates 2A and 3A.

The present method does not need an annealing process at 1000° C. or higher after the substrates 2A and 3A are joined. Thus, the substrates 2A and 3A can be reliably joined without any damage. In addition, the method with the surface activation process does not need any adhesive agent such as resin or metal and realizes a height-reduced package, so that downsizing of package can be achieved. Further, a sufficient joining strength can be obtained by a smaller joining interface area than that for the adhesive, so that the package can be miniaturized.

The matching circuit 4, which matches the input impedance of the transmit filter 10a and that of the receive filter 10b, may easily be formed by silicon deposited on the circuit board 3 (multi-board substrate 3A) at the wafer level in the ordinary semiconductor laminating technique. The cap 2 may be made of silicon. In this case, reactive ion etching (RIE), particularly, deep-RIE may be employed so that the multiple caps 3 can be produced at the wafer level.

The principles of the invention mentioned above are exemplarily directed to the duplexer. Even the following embodiments of the invention are directed to the duplexer. However, the present invention is not limited to the duplexer but includes a SAW device equipped with a single SAW filer chip or three SAW filter chips or more. The use of the single SAW chip may omit the matching circuit.

First Embodiment

A first embodiment of the present invention is a duplexer having the transmit filter 10a and the receive filter 10b mentioned before. This duplexer has the same structure as that of the duplexer 1.

Figure 7A:
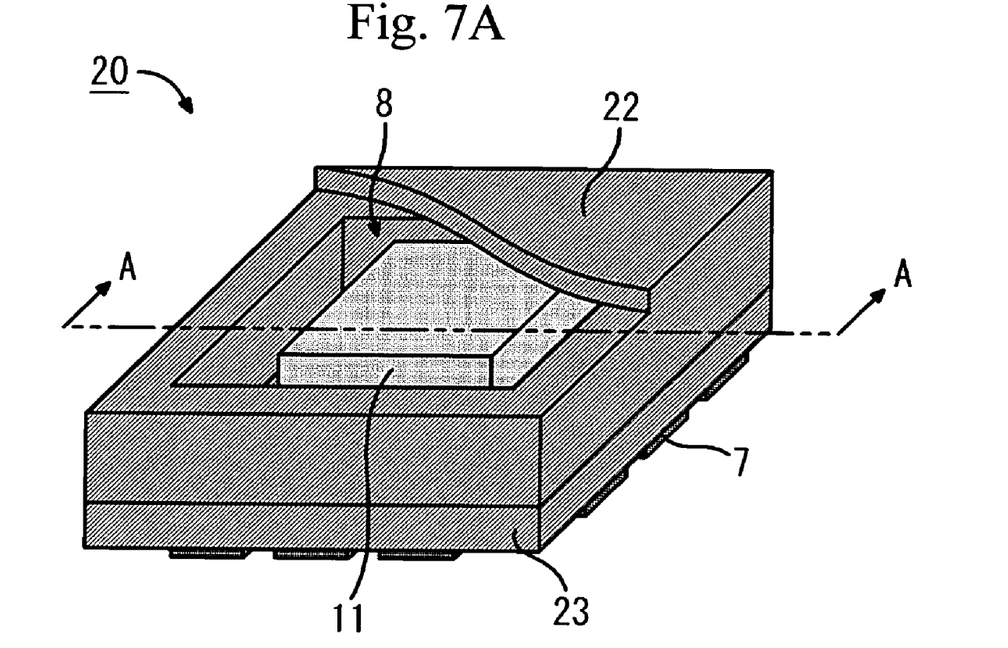
FIG. 7A is a perspective view of a duplexer according to a first embodiment of the present invention.
Figure 7B:
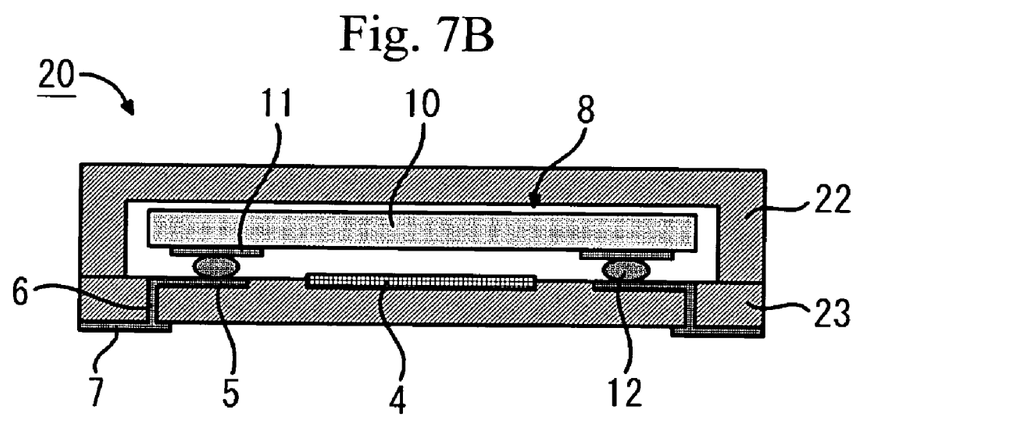
FIG. 7B is a cross-sectional view of the duplexer taken along a line A-A shown in FIG. 7A.

FIG. 7A is a perspective view of a duplexer 20 of the present embodiment, and FIG. 7B is a cross-sectional view taken along a line A-A shown in FIG. 7A. In these figures, parts that are the same as those shown in the previously described figures are given the same reference numerals.

The duplexer 20 has a circuit board 23 on which the SAW chip 10 is flip-chip mounted so that the main surface of the SAW chip 10 faces the die-attached surface of the circuit board 23. The SAW chip 10 is hermetically sealed in the cavity 8 of a cap 22.

The circuit board 23 can be produced by processing a substrate that contains silicon as the major component. Silicon can be processed easily and is less expensive. Patterns that are as shown in FIGS. 8A and 8B or FIGS. 9A and 9B may be formed therein and thereon by RIE (including deep-RIE), photolithographic technique or sputtering. Preferably, the silicon substrate has a resistivity equal to or greater than 100 Ω·cm in order to prevent degradation of the filter characteristic of the SAW chip 10 due to the resistance of silicon. This condition may be applied to the cap 22 made of silicon.

Figure 8A:
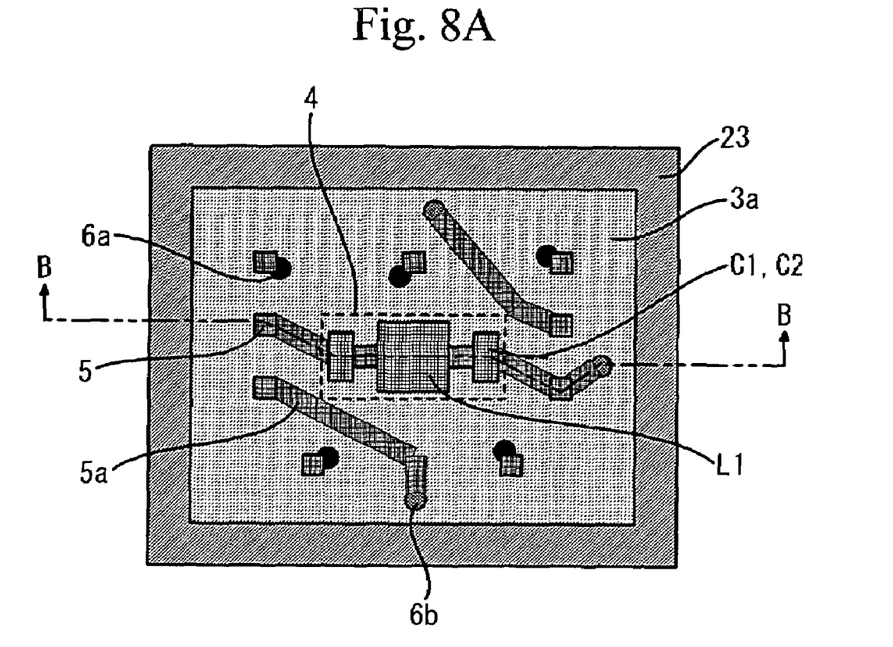
FIG. 8A is a circuit board employed in the duplexer shown in FIGS. 7A and 7B.
Figure 8B:
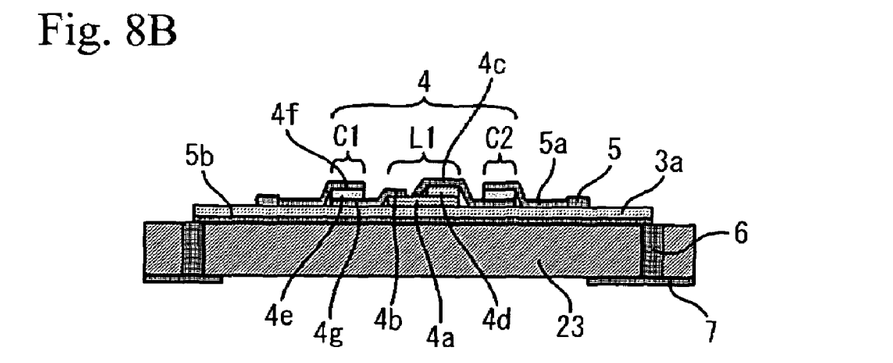
FIG. 8B is a cross-sectional view taken along a line B-B shown in FIG. 8A.
Figure 8C:
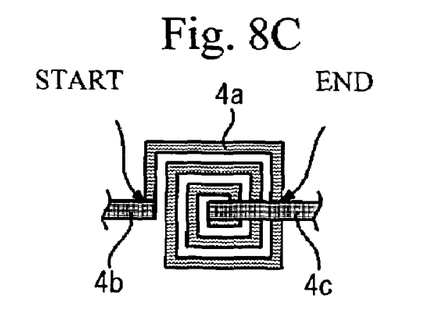
FIG. 8C is a plan view of an inductor employed in the duplexer shown in FIGS. 8A and 8B.
Figure 8D:
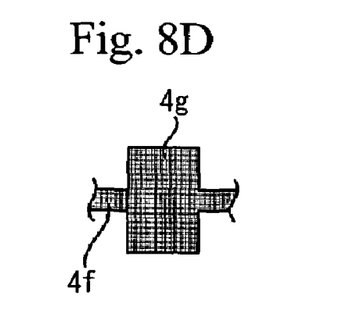
FIG. 8D is a plan view of a capacitor employed in the duplexer shown in FIGS. 8A and 8B.

The patterns formed on the circuit board 23 will now be described in detail. FIG. 8A shows the die-attached surface of the circuit board 23, and FIG. 8B is a cross-sectional view taken along a line B-B shown in FIG. 8A. FIG. 8C shows a structure that realizes the inductor L1 of the matching circuit 4, and FIG. 8D shows a structure of the capacitors C1 and C2 of the matching circuit 4.

Referring to these figures, a ground pattern 5b, which may be set at the ground potential, is laminated on the circuit board 23. An insulator layer 3a is provided on the ground pattern 5b. On the insulator layer 3a, there are the electrode pads 5, a wiring pattern 5a, the inductor L1 and the capacitors C1 and C2.

The electrode pads 5, which are mechanically and electrically connected to the input/output pads 11 of the SAW chip 10 via the bumps 12, are formed so as to correspond to the pads 11 in positions. Each of the pads 5 is connected to the matching circuit 4 or is connected directly or indirectly via the wiring pattern 5a to a via-wiring line 6a or 6b that penetrates the insulator layer 3a.

As shown in FIGS. 8B and 8C, the inductor L1 of the matching circuit 4 includes an electrode 4a spirally formed. The start end of the inductor L1 is connected to a wiring pattern 4b, and the end thereof is connected to a wiring pattern 4c. An insulator layer 4d is sandwiched between the electrode 4a and the wiring pattern 4c. The electrode 4a may be made of a conductor, which is, for example, copper or gold. The wiring patterns 4b and 4c may be formed by a single conductive layer that contains at least one of Au, Al, Cu, Ti, Cr and Ta, or by a laminate of conductive layers, each of which contains at least one of the above metals. The metals may be deposited by sputtering or the like.

As shown in FIGS. 8B and 8D, the capacitors C1 and C2 of the matching circuit 4 is each composed of a dielectric layer 4e, an upper electrode 4f and a lower electrode 4g. The dielectric layer 4e is sandwiched between the upper electrode 4f and the lower electrode 4g. The electrodes 4f and 4g are integrally formed with the electrode pattern 5a, and may be formed by a single conductive layer that contains at least one of Au, Al, Cu, Ti, Cr and Ta, or by a laminate of conductive layers, each of which contains at least one of the above metals. Sputtering may be employed for deposition of metal. Preferably, the electrodes 4f and 4g are made of the same material as the electrode pads 5. This facilitates simplification of the production process and improves the yield and efficiency.

Figure 9A:
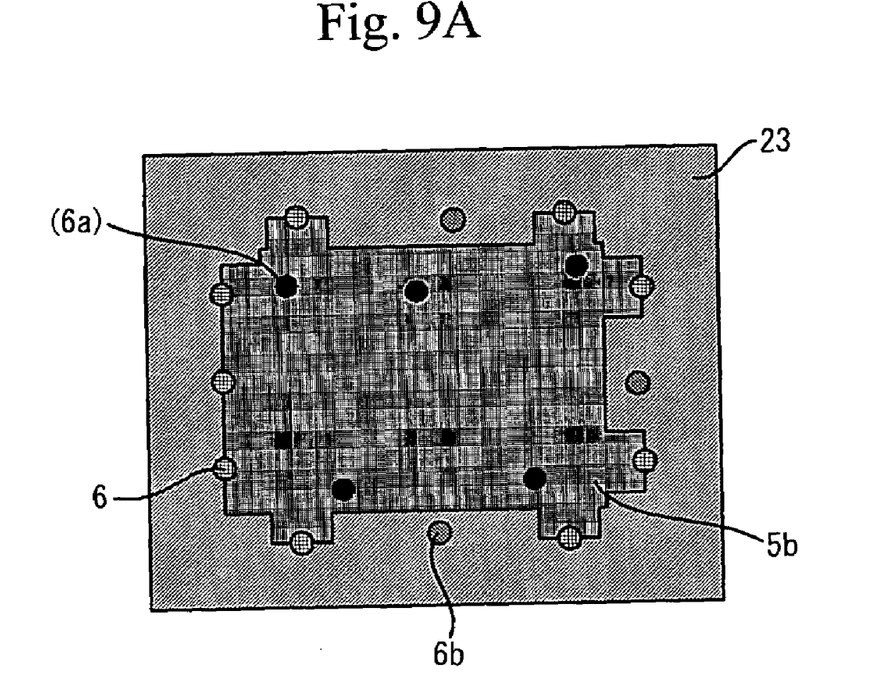
FIG. 9A is a plan view of a circuit board employed in the duplexer according to the first embodiment of the present invention.
Figure 9B:
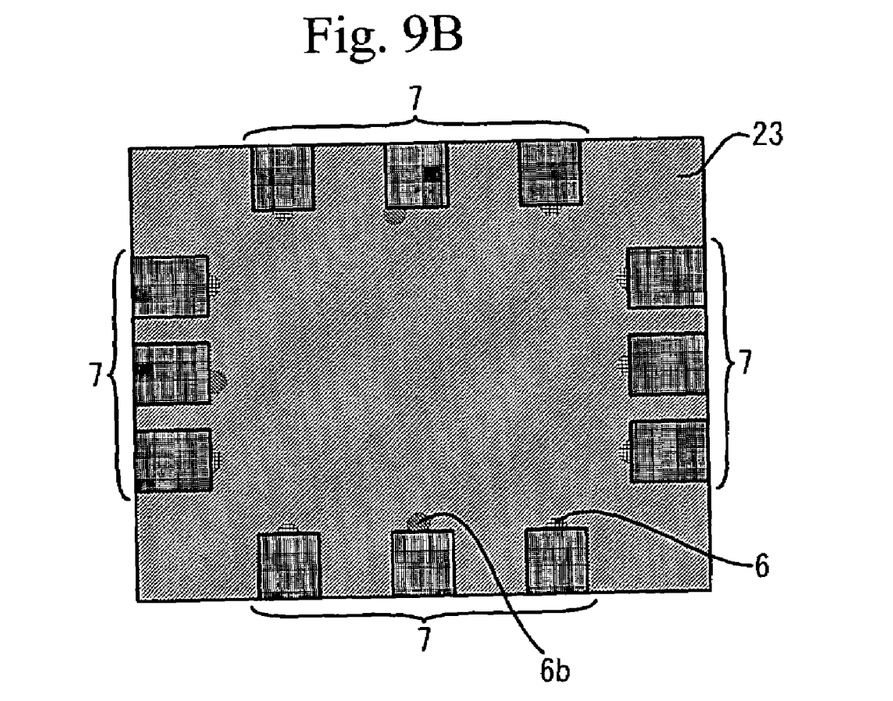
FIG. 9B is a bottom view of the duplexer according to the first embodiment of the present invention.

As is shown in FIGS. 9A and 9B, the via-wiring lines that penetrate the insulator layer 3a include via-wiring lines 6a for ground and via-wiring lines 6b for signal transmission. As shown in FIG. 9A, the via-wiring lines 6a for ground are connected to the ground pattern 5b underlying the insulator layer 3. The ground pattern 5b may be formed by a single conductive layer that contains at least one of Au, Al, Cu, Ti, Cr and Ta, or by a laminate of conductive layers, each of which contains at least one of the above metals. Sputtering may be employed for deposition of metal. As shown in FIG. 9B, the ground pattern 5b is electrically connected to some foot patterns 7 formed on the backside of the circuit board 23 via the via-wiring lines 6 that penetrate the circuit board 23. The foot patterns 7 connected to the ground pattern 5b via the via-wiring lines 6a are grounded. Thus, the ground pattern 5b is set at the ground potential. The via-wiring lines 6b for signal transmission penetrate the circuit board 23 in areas in the absence of the ground pattern 5b, and are electrically connected to some foot patterns 7 on the backside of the circuit board 23 as shown in FIG. 9B. An RF signal may be externally applied to the given foot pattern 7 connected to the via-wiring line 6b for signal transmission.

The SAW chip 10 is flip-chip mounted on the circuit board 23 mentioned above, and is hermetically sealed with the cap 22 having the cavity 8, as shown in FIGS. 7A and 7B. The cap 22 may contain silicon as the major component like the circuit board 23. The cavity 8 can be formed in the silicon substrate by RIE, preferably, deep-RIE. It should be appreciated that the cavity 8 is formed in the cap 2. The walls that define the cavity 8 secure the strength of the cap 2. This results in thinning the package.

Preferably, the surface activation process is used to join the circuit board 23 and the cap 22. The surface activation process does not apply any thermal damage to the circuit board 23 and the cap 22 because it does not need annealing at 1000° C. or higher after joining. In addition, the multi-board substrate and the multi-cap substrate mentioned before can be used to produce a number of devices at a time.

In the surface activation process, the joining surfaces of the substrates 2A and 3A are cleaned through RCA cleaning or the like, are exposed to ion beams, neutralized high-energy atom beams, or plasma of inert gas such as Ar or oxygen, so that residual impurities are removed, and that the surfaces can be activated. This results in amorphous layers on the joining surfaces of the cap 22 and the circuit board 23. The amorphous layers are a few nanometers thick. Since the cap 22 and the circuit board 23 are made of silicon, the amorphous layers contain silicon as the major component. Then, the cap 22 and the circuit board 23 are mutually positioned and joined, so that the SAW chip 10 mounted on the circuit board 23 is sealed with the cap 22. Preferably, the joining process is carried out in vacuum. It is also possible to join the cap 22 and the circuit board 23 in air or an atmosphere of a high purity gas such as nitrogen or an inert gas. It might be necessary to press the cap 22 and the circuit board 23 from both sides. This joining process can be carried out at room temperature or by heating the cap 22 and the circuit board 23 at a temperature of 100° C. or lower. The use of heating may increase the joining strength.

The surface activation process for the cap 22 and the circuit board 23 both made of silicon does not need an annealing process at 1000° C. or higher after joining. Thus, the cap 22 and the circuit board 23 can be reliably joined without any damage. In addition, the method with the surface activation process does not need any adhesive agent such as resin or metal and realizes a height-reduced package, so that downsizing of package can be achieved. Further, a sufficient joining strength can be obtained by a smaller joining interface area than that for the adhesive, so that the package can be miniaturized.

The use of the surface activation process enables the process sequence of joining the multi-cap substrate and the multi-board substrate first and dividing the substrates thus joined into separate devices by using a dicing blade or laser beam. Thus, the productivity can be improved and the cost can be reduced.

Second Embodiment

Figure 10A:
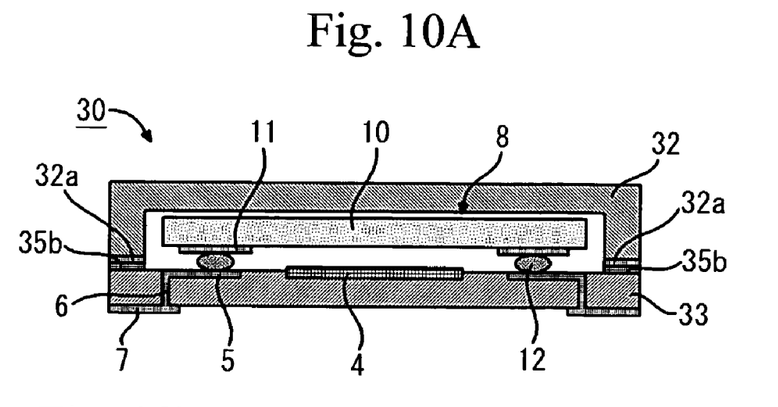
FIG. 10A is a cross-sectional view of a duplexer according to a second embodiment of the present invention.
Figure 10B:
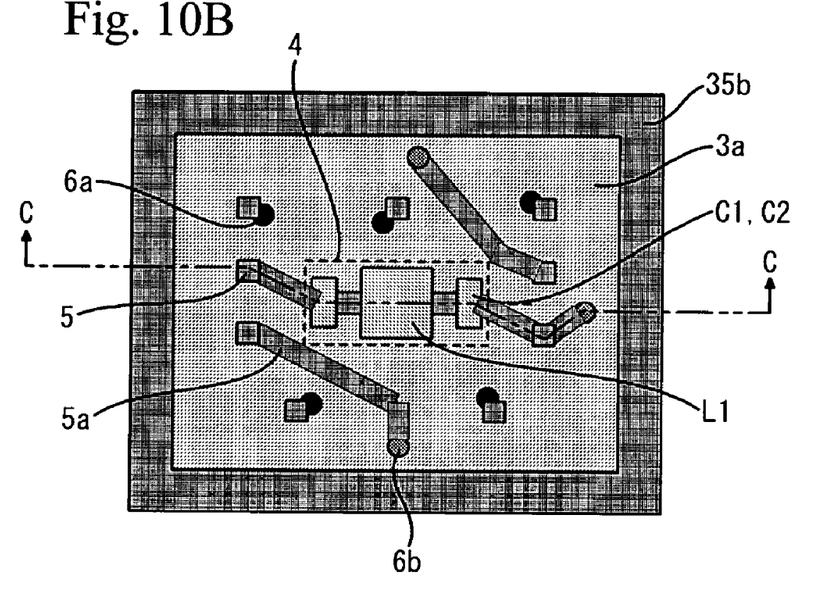
FIG. 10B is a plan view of a circuit board employed in the duplexer shown in FIG. 10A.
Figure 10C:
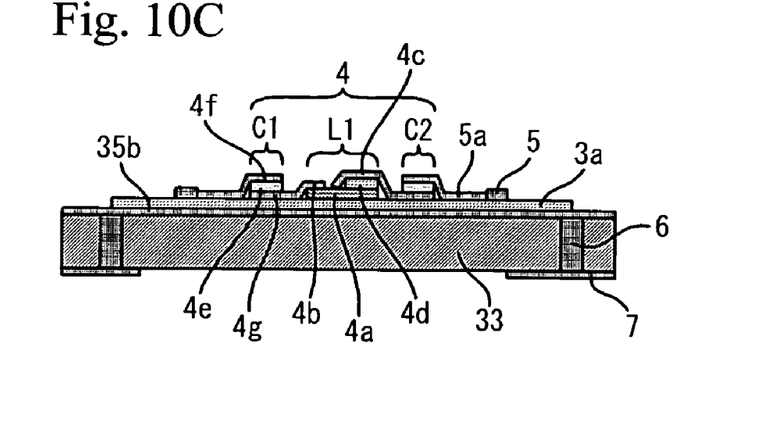
FIG. 10C is a cross-sectional view taken along a line C-C shown in FIG. 10B.

FIGS. 10A through 10C and 11 show a duplexer 30 according to a second embodiment of the present invention. More particularly, FIG. 10A is a cross-sectional view of the duplexer 30 (which corresponds to the cross-sectional view of FIG. 7B). FIG. 10B is a plan view of a circuit board 33, and FIG. 10C is a cross-sectional view taken along a line C-C shown in FIG. 10B. The duplexer 30 has almost the same perspective view as shown in FIG. 7A.

As shown in FIG. 10A, the duplexer 30 has the circuit board 33 containing silicon as the major component. The SAW chip 10 is flip-chip mounted on the die-attached surface of the circuit board 33. The SAW chip 10 is housed in the cavity 8 of a cap 32, and is hermetically sealed therewith.

Metal layers, which may be made of gold or the like, are provided to the joining surfaces of the cap 32 and the circuit board 33. The cap 32 and the circuit board 33 are joined by directly joining the metal surfaces.

This will now be described in more detail. A metal layer 32a is formed on the joining surface of the cap 32. The metal layer 32 may be formed by a single conductive layer that contains at least one of Au, Al, Cu, Ti, Cr and Ta, or by a laminate of conductive layers, each of which contains at least one of the above metals. Sputtering may be used to deposit metal. A ground pattern 35b is provided in the joining area on the main surface of the circuit board 33. The ground pattern 35b corresponds to the ground pattern 5b of the first embodiment. In the second embodiment, the metal layer 32a and the ground pattern 35b are directly joined, so that the cap 32 and the circuit board 33 can be joined. The metal layer 32a and/or the ground pattern 35b may be exposed to the surface activation process. It is also possible to omit the metal layer 32a and the ground pattern 35b and directly join the cap 32 and the circuit board 33 after the surface activation process for the joining surfaces.

Figure 11:
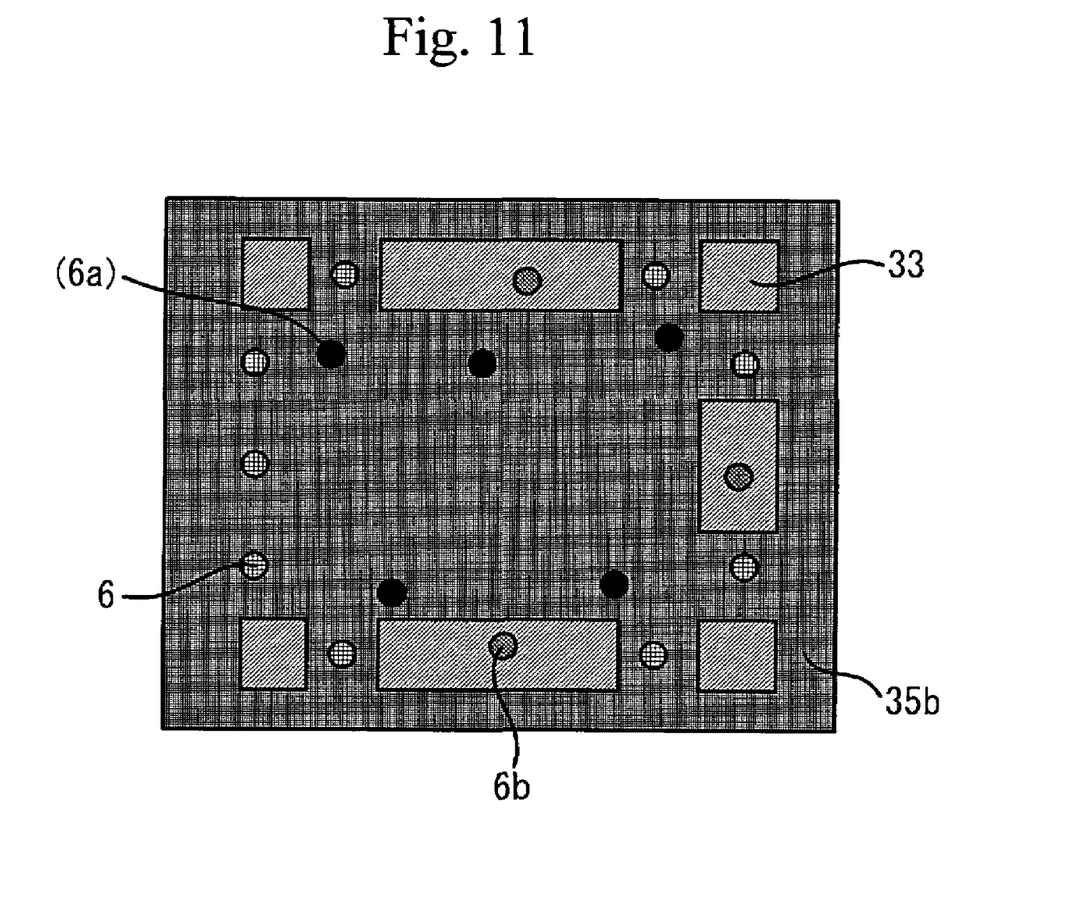
FIG. 11 shows ground patterns and via-wiring lines formed on the circuit board shown in FIGS. 10A through 10C.

The via-wiring lines 6b for signal transmission should be electrically isolated from the ground pattern 35b. Thus, as shown in FIG. 11, the ground pattern 35b is not provide in the areas that include the via-wiring lines 6b for signal transmission.

As described above, the cap 32 and the circuit board 33 can be joined by directly joining the respective metal layers. Except the above, the second embodiment is almost the same as the first embodiment.

Third Embodiment

Figure 12A:
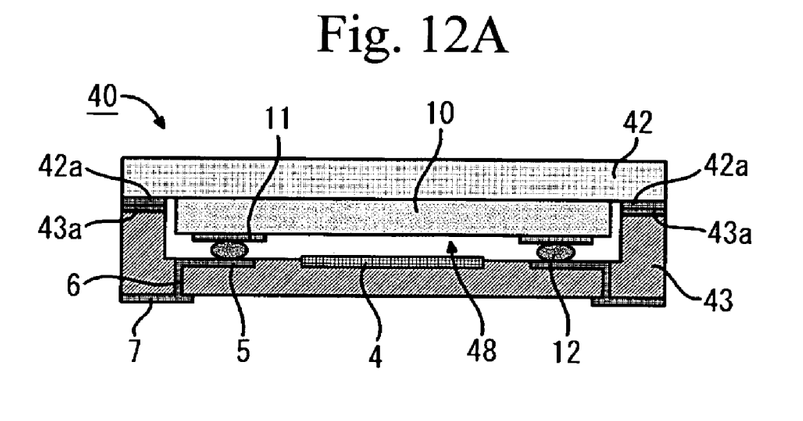
FIG. 12A is a cross-sectional view of a duplexer according to a third embodiment of the present invention.
Figure 12B:
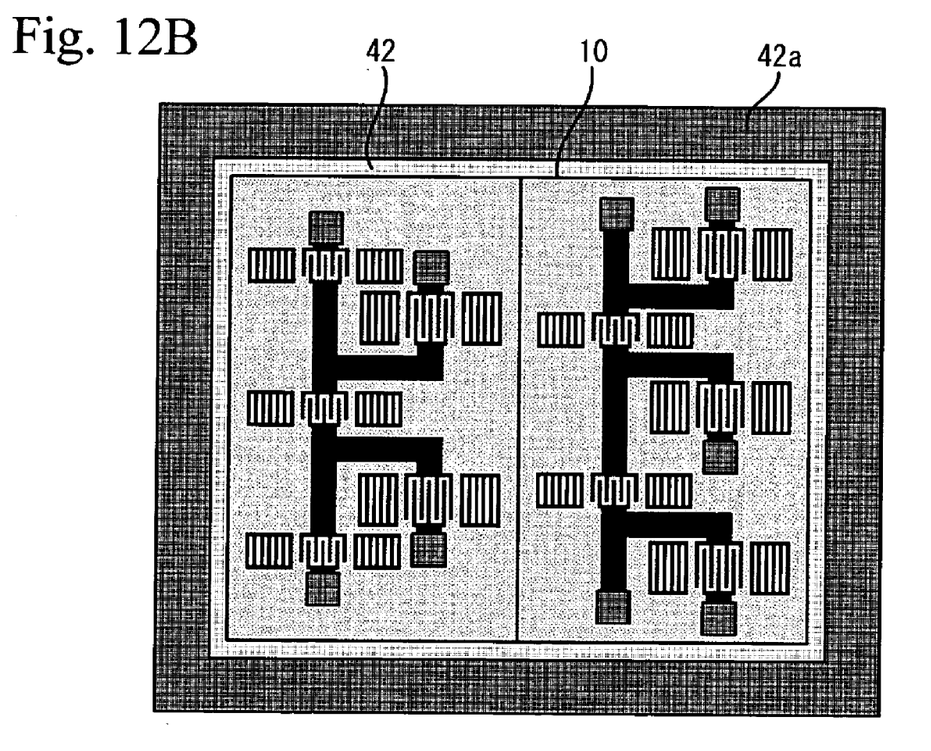
FIG. 12B is a plan view of a cap of the duplexer to which a SAW chip is attached.

FIGS. 12A and 12B show a duplexer 40 according to a third embodiment of the present invention. More particularly, FIG. 12A is a cross-sectional view of the duplexer 40 (which corresponds to that of FIG. 7B), and FIG. 12B is a plan view of a cap 42 to which the SAW chip 10 is bonded.

A cavity 48 is defined in a circuit board 43 to which the cap 42 having plate shape is joined. The SAW chip 10 is bonded to the cap 42. The circuit board 43 may be a silicon substrate. Similarly, the cap 42 may be a silicon substrate. The cap 42 may be a sapphire substrate. In the following, the silicon substrates are used.

Metal layers 42a and 43a are formed on the joining surfaces of the cap 42 and the circuit board 43. The metal layers 42a and 43a may be formed by a single conductive layer that contains at least one of Au, Al, Cu, Ti, Cr and Ta, or by a laminate of conductive layers, each of which contains at least one of the above metals. The metals may be deposited by sputtering or the like.

The direct joining of the metal layers 42a and 43a brings about joining of the cap 42 and the circuit board 43. The joining surfaces of the metal layers 42 and 43 may be subjected to the surface activation process. Alternatively, the joining surfaces of the cap 42 and the circuit board 43 may be subjected to the surface activation process in joining without the metal layers 42a and 43a being omitted.

The cap 42 serves as a member that supports the piezoelectric substrate 15 of the SAW chip 10. This enables thinning of the piezoelectric substrate 15, as compared to the other embodiments. Thus, the duplexer can be further thinned. The cap 42 and the SAW chip 10 may be joined by the method using the surface activated bonding.

Though the cap 42 mentioned above is made of silicon, it may be a sapphire substrate. The sapphire substrate functions to restrict thermal expansion of the piezoelectric substrate 15 due to stress of biasing stemming from the relation between the elastic stiffness (C11) and the thermal expansion coefficient of sapphire and those of the piezoelectric substrate of LT or the equivalent. This improves the stability of the frequency response of the SAW chip 10 as the function of temperature change.

According to the third embodiment, the SAW device can be further downsized, and the use of the sapphire substrate can improve the stability of the frequency response of the SAW chip 10 that is degraded by temperature change.

Fourth Embodiment

Figure 13:
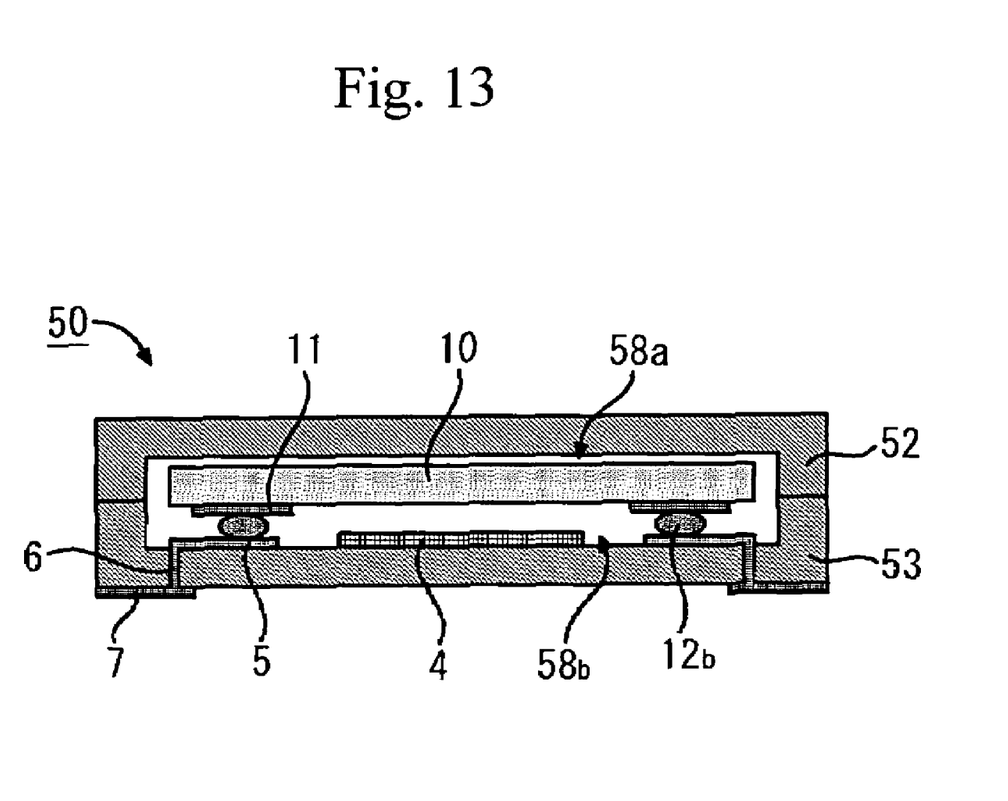
FIG. 13 is a cross-sectional view of a duplexer according to a fourth embodiment of the present invention.

FIG. 13 is a cross-sectional view of a duplexer 50 according to a fourth embodiment of the present invention, which corresponds to the cross-sectional view of FIG. 7B.

The duplexer 50 has a cap 52 having a cavity 58a, and a circuit board 53 having another cavity 58b. The cap 52 and the circuit board 53 may be joined directly by using the surface activation process or joined by using metal layers provided on the joining surfaces. In the latter case, the metal layers may be joined directly or using the surface activation process.

According to the fourth embodiment, the downsized duplexer 50 can be produced.

The present invention is not limited to the specifically described embodiments, but may include other embodiments, variations and modifications without departing from the scope of the present invention.

The present invention is based on Japanese Patent Application No. 2003-104593 filed on Apr. 8, 2003, the entire disclosure of which is hereby incorporated by reference.

What is claimed is:

1. A surface acoustic wave device comprising:
   a first substrate;
   a surface acoustic wave chip attached to the first substrate; and
   a second substrate that hermetically seals the surface acoustic wave chip,
   the first substrates comprising one of silicon and sapphire as a major component, and the second substrate comprising silicon as a major component,
   the first and second substrates having joining surfaces processed by a surface activation process,
   an electric circuit being formed on a surface area of the second substrate other than the joining surfaces and facing the surface acoustic wave chip,
   the second substrate having second electrode pads electrically connected to first electrode pads formed on the surface acoustic wave chip,
   the surface acoustic wave chip having a back surface attached to a surface of the first substrate by another surface activation process,
   the first and second electrode pads facing each other and being bonded, so that the surface acoustic wave chip can be mechanically and electrically connected to the second substrate.

2. The surface acoustic wave device as claimed in claim 1, wherein both the joining surfaces of the first and second substrates are processed by the a surface activation process.

3. The surface acoustic wave device as claimed in claim 1, further comprising a metal layer interposed between the joining surfaces of the first and second substrates.

4. The surface acoustic wave device as claimed in claim 3, wherein the first and second substrates form a flat side surface of the surface acoustic wave device.

5. A surface acoustic wave device comprising:
   a first substrate;
   a surface acoustic wave chin attached to the first substrate; and
   a second substrate that hermetically seals the surface acoustic wave chip,
   one of the first and second substrates comprising silicon as a major component and the other comprising sapphire as a major component,
   the first and second substrates having joining surfaces,
   an electric circuit being formed on a surface area of at least one of the first and second substrates.

6. The surface acoustic wave device as claimed in claim 5, wherein:
   the surface acoustic wave chip has first pads, and the first substrate has second pads electrically connected to the first pads; and
   the surface acoustic wave chip is mounted on the first substrate so that the first pads face the second pads.

7. The surface acoustic wave device as claimed in claim 5, wherein:
the surface acoustic wave chip has first pads, and the second substrate has second pads electrically connected to the first pads; and
the surface acoustic wave chip is mounted on the second substrate so that the first pads face the second pads.

8. The surface acoustic wave device as claimed in claim 6, wherein the surface acoustic wave chip has a back surface spaced apart from the second substrate.

9. The surface acoustic wave device as claimed in claim 7, wherein the surface acoustic wave chip has a back surface attached to the second substrate.

10. The surface acoustic wave device as claimed in claim 1, wherein one of the fast and second substrates has a cavity that houses the surface acoustic wave chip.

11. The surface acoustic wave device as claimed in claim 1, wherein the first and second substrates have respective cavities in which the surface acoustic wave chip is housed.

12. The surface acoustic wave device as claimed in claim 1, wherein the surface acoustic wave device comprises at least one filter.

13. The surface acoustic wave device as claimed in claim 1, wherein the electric circuit comprises an impedance matching circuit electrically connected to the surface acoustic wave chip.

14. The surface acoustic wave device as claimed in claim 1, wherein:
the surface acoustic wave device comprises two filters connected to a common input/output terminal; and
the electric circuit comprises an impedance matching circuit provided between the common input/output terminal and at least one of the two filters.

15. The surface acoustic wave device as claimed in claim 1, wherein said at least one of the first and second substrates that comprises silicon has a resistivity equal to or greater than 100 O·cm.

16. The surface acoustic wave device as claimed in claim 1, wherein the first substrate has a plate shape and the second substrate has sidewalls that define a cavity housing the surface acoustic wave chip.

17. The surface acoustic wave device as claimed in claim 1, wherein the first substrate has sidewalls that define a cavity housing the surface acoustic wave chip, and the second substrate has a plate shape.

18. The surface acoustic wave device as claimed in claim 3, wherein the metal layer comprises gold.

* * * * *